United States Patent
Tanaka

(10) Patent No.: US 8,718,999 B2
(45) Date of Patent: May 6, 2014

(54) CIRCUIT SIMULATION METHOD AND CIRCUIT SIMULATION DEVICE

(75) Inventor: Genichi Tanaka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 109 days.

(21) Appl. No.: 13/116,612

(22) Filed: May 26, 2011

(65) Prior Publication Data
US 2011/0307234 A1 Dec. 15, 2011

(30) Foreign Application Priority Data

Jun. 9, 2010 (JP) ................................. 2010-132105

(51) Int. Cl.
*G06F 17/50* (2006.01)
*G06F 7/60* (2006.01)

(52) U.S. Cl.
USPC ................... 703/14; 703/15; 703/16; 703/17; 703/18; 703/19; 703/20

(58) Field of Classification Search
None
See application file for complete search history.

(56) References Cited

U.S. PATENT DOCUMENTS

| | | | |
|---|---|---|---|
| 5,555,201 A * | 9/1996 | Dangelo et al. | 716/102 |
| 5,838,947 A * | 11/1998 | Sarin | 703/14 |
| 5,867,399 A * | 2/1999 | Rostoker et al. | 716/102 |
| 5,920,489 A * | 7/1999 | Dibrino et al. | 716/103 |
| 6,066,177 A * | 5/2000 | Hatsuda | 703/19 |
| 6,112,022 A * | 8/2000 | Wei | 703/14 |
| 6,782,347 B2 | 8/2004 | Hirano et al. | |
| 7,039,572 B1 * | 5/2006 | Narahara et al. | 703/14 |
| 7,295,938 B2 | 11/2007 | Nakashiba et al. | |
| 7,313,510 B2 * | 12/2007 | Karunaratne | 703/14 |
| 7,882,464 B1 * | 2/2011 | Rochel et al. | 716/136 |
| 8,365,125 B1 * | 1/2013 | Rochel et al. | 716/120 |
| 8,370,778 B1 * | 2/2013 | Rochel et al. | 716/106 |
| 8,370,779 B1 * | 2/2013 | Rochel et al. | 716/106 |
| 2002/0065643 A1 * | 5/2002 | Hirano et al. | 703/19 |
| 2006/0111885 A1 * | 5/2006 | Abe | 703/19 |

FOREIGN PATENT DOCUMENTS

JP 2006-277557 10/2006

OTHER PUBLICATIONS

Harizi et al. "Efficient Modeling Techniques for Dynamic Voltage Drop Analysis", ACM 2007.*
Kim et al. "Power Supply Network Aware Timing Analysis Using S-parameter in Nanometer Digital Circuits", IEEE Design & Test of Computers, 2006.*

(Continued)

*Primary Examiner* — Shambhavi Patel
(74) *Attorney, Agent, or Firm* — McDermott Will & Emery LLP

(57) ABSTRACT

The present invention provides a circuit simulation method of executing a high-precision circuit simulation. A voltage fluctuation analysis step at a gate level is executed (step S2). The voltage fluctuation analysis step at the gate level is executed on an entire chip TP. Next, a step of obtaining waveforms of power supply voltage and ground voltage (Vss) according to the voltage fluctuation analysis step is executed (step S4). Subsequently, a signal analysis step at a transistor level is performed (step S6). The signal analysis step at the transistor level is performed in an area narrower than the entire chip TP, for example, on one or more functional modules. After that, a step of obtaining a signal analysis result according to the signal analysis step is executed (step S8).

6 Claims, 8 Drawing Sheets

(56) References Cited

OTHER PUBLICATIONS

Huang et al. "A Novel Methodology for Transistor-Level Power Estimation", 1996.*

Panda et al. "Model and Analysis for Combined Package and Power Grid Simulation", 2000.*

Lee et al. "Library-Based Gate-Level Current Waveform Modeling for Dynamic Supply Noise Analysis", 2012.*

Texas Instruments: "Power distribution for deep-submicron SoC designs", 2001.*

Japanese Office Action issued in corresponding Japanese Application No. JP2010-132105, dated Dec. 3, 2013, with English translation.

* cited by examiner

CIRCUIT SIMULATION METHOD AND CIRCUIT SIMULATION DEVICE

CROSS-REFERENCE TO RELATED APPLICATIONS

The disclosure of Japanese Patent Application No. 2010-132105 filed on Jun. 9, 2010 including the specification, drawings and abstract is incorporated herein by reference in its entirety.

BACKGROUND

The present invention relates to a circuit simulation for a reliability test on a model of a semiconductor integrated circuit.

To ship semiconductor integrated circuit devices having higher reliability, various reliability tests are conducted on the semiconductor integrated circuit devices before shipment of the products.

As the process is becoming finer, the influences of physical phenomena such as crosstalk, electromigration, hot-carrier degradation, power supply voltage drop (IR drop), and the like are becoming more conspicuous. As a result, the influence is exerted on the operation of a semiconductor integrated circuit device. The phenomena are caused by resistance in a power supply wire for supplying power in circuits, and the influence is exerted also by simultaneous switching of a plurality of circuits. When a voltage drop is large, the operation speed of the circuit decreases, and it causes erroneous operation of the circuit. Consequently, analysis of a voltage drop in the entire semiconductor integrated circuit device (entire chip) is being proposed (Japanese Unexamined Patent Publication No. 2006-277557).

SUMMARY

As a circuit simulation at the transistor level, an SPICE (Simulation Program Integrated Circuit Emphasis) simulation is known.

Generally, with increase in the number of devices in an integrated circuit in recent years, the arithmetic process amount is becoming enormous in a circuit simulation at the transistor level, so that it takes considerable time to execute the SPICE simulation in the entire semiconductor integrated circuit device, and it is not realistic. Therefore, the SPICE simulation is used as a simulation executed only on a part of a chip.

Since the SPICE simulation is a partial-circuit simulation, a simulation using an ideal power supply model is executed on a power supply voltage which is supplied.

However, voltage drops and the like which occur in actual power supply voltages occur in relation with the operations of other peripheral circuits. In the ideal power supply model, therefore, a high-precision circuit simulation cannot be executed.

The present invention has been achieved to solve such a problem and an object of the invention is to provide a circuit simulation method and a circuit simulation device for executing a high-precision circuit simulation.

As an embodiment of the present invention, a circuit simulation method for verifying a semiconductor integrated circuit including a plurality of gates realizing a specific function by using a transistor includes the steps of: executing a voltage fluctuation analysis at a gate level on the semiconductor integrated circuit; and executing a signal analysis at a transistor level on a partial region in the semiconductor integrated circuit by using a result of the voltage fluctuation analysis.

According to the embodiment of the invention, since the voltage fluctuation analysis at the gate level is executed, the voltage fluctuation analysis simulation can be performed in short time. Since the signal analysis at the transistor level is executed on the basis of the analysis result, a high-precision circuit simulation can be realized.

DETAILED DESCRIPTION

Figure 1:
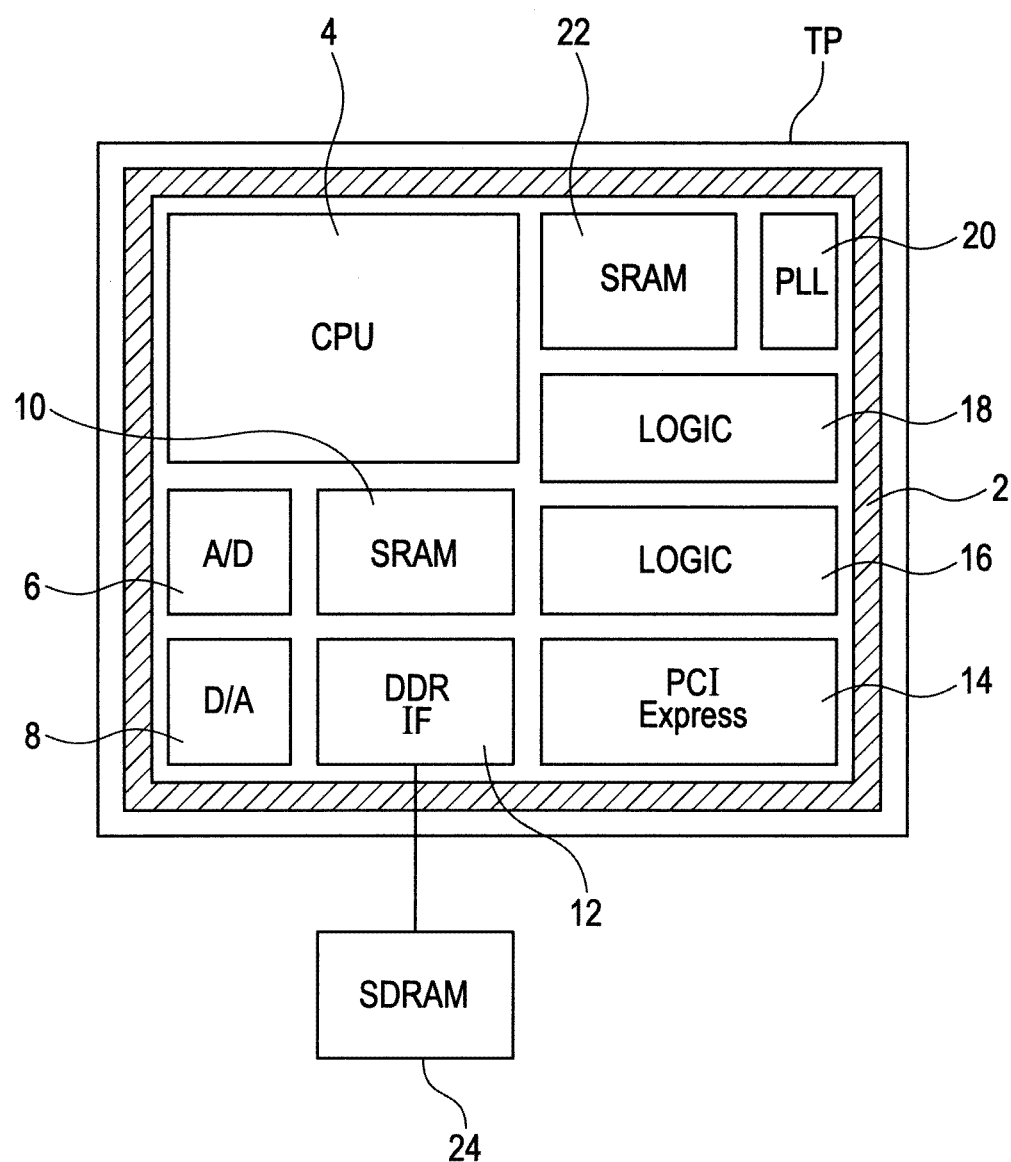
FIG. 1 is a schematic diagram for explaining an entire semiconductor integrated circuit device according to an embodiment of the present invention.

Embodiments of the present invention will be described in detail with reference to the drawings. In the drawings, the same reference numeral shows the same or corresponding part.

FIG. 1 is a schematic diagram for explaining an entire semiconductor integrated circuit device according to an embodiment of the invention. In FIG. 1, a plurality of functional modules are mounted over an entire semiconductor integrated circuit device, so-called chip TP according to the embodiment of the present invention.

Concretely, the diagram shows the case where a CPU (Central Processing Unit) 4, an A/D converter 6, a D/A converter 8, SRAMs (Static Random Access Memories) 10 and 22, a DDR (Double Data Rate) I/F 12, a PCI express I/F 14, logic circuits 16 and 18, a PLL (Phase Locked Loop) circuit 20, and an I/O (Input/Output) region 2 are provided as functional modules over the chip TP.

The CPU 4 is an arithmetic processing circuit which controls the entire chip TP. The A/D converter 6 is a circuit for converting an analog signal to a digital signal. The D/A converter 8 is a circuit for converting a digital signal to an analog signal. The SRAMs 10 and 22 are memories for storing data by using a sequential circuit such as a flip flop circuit. The DDR I/F 12 is an interface circuit for an SDRAM (Synchronous Dynamic Random Access Memory) provided on the outside. The PCI express I/F 14 is a high-speed serial transfer interface. The logic circuits 16 and 18 are provided with various logic circuits. The PLL circuit 20 is a circuit for generating a frequency signal such as a clock. The I/O region 2 is a region in which wires for inputting/outputting signals to/from the components are provided.

The chip configuration is an example. The present invention is not limited to the configuration and may employ other configurations.

A circuit simulation device for executing the circuit simulation method according to the embodiment of the present invention is configured by, for example, installing software in a computer having the CPU, the memories, and the input/output device. From the viewpoint of functions, the device has components having functions which execute steps shown in FIG. 2.

Figure 2:
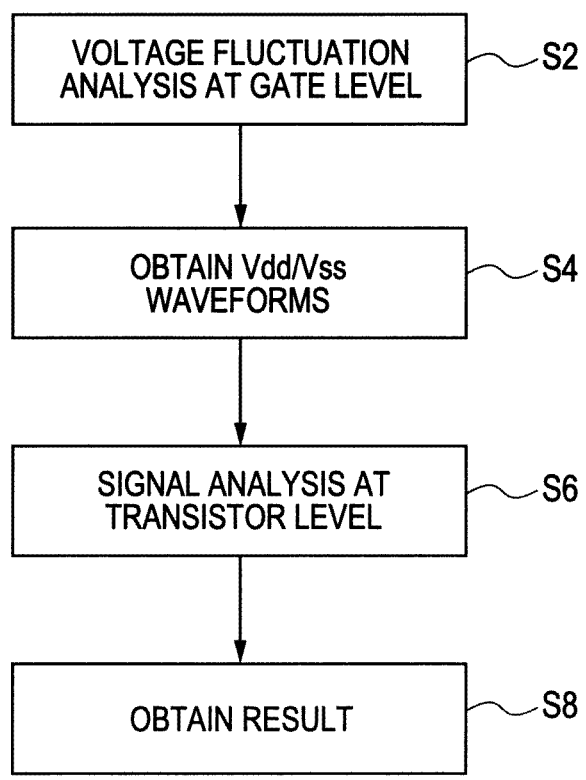
FIG. 2 is a diagram for explaining a circuit simulation method according to an embodiment of the present invention.

FIG. 2 is a diagram for explaining a circuit simulation method according to an embodiment of the present invention.

Referring to FIG. 2, first, a step of analyzing a voltage fluctuation at a gate level is executed (step S2). In the example, the voltage fluctuation analysis step at the gate level is performed on the entire chip TP. Fluctuations in the power supply voltage and the ground voltage in a plurality of portions in each of power supply wires and grounding wires in the chip are analyzed. The respective portions are, for example, portions in the power supply wires and the ground wires on the instant unit basis.

Next, a step of obtaining the waveforms of the power supply voltage (Vdd) and the ground voltage (Vss) according to the voltage fluctuation analysis step is executed (step S4).

Subsequently, a signal analysis step at the transistor level is executed (step S6). The signal analysis step at the transistor level is executed in an area smaller than the entire chip, for example, on not all but one or more functional modules.

After that, a step of obtaining a signal analysis result of the signal analysis step is executed (step S8).

Figure 3:
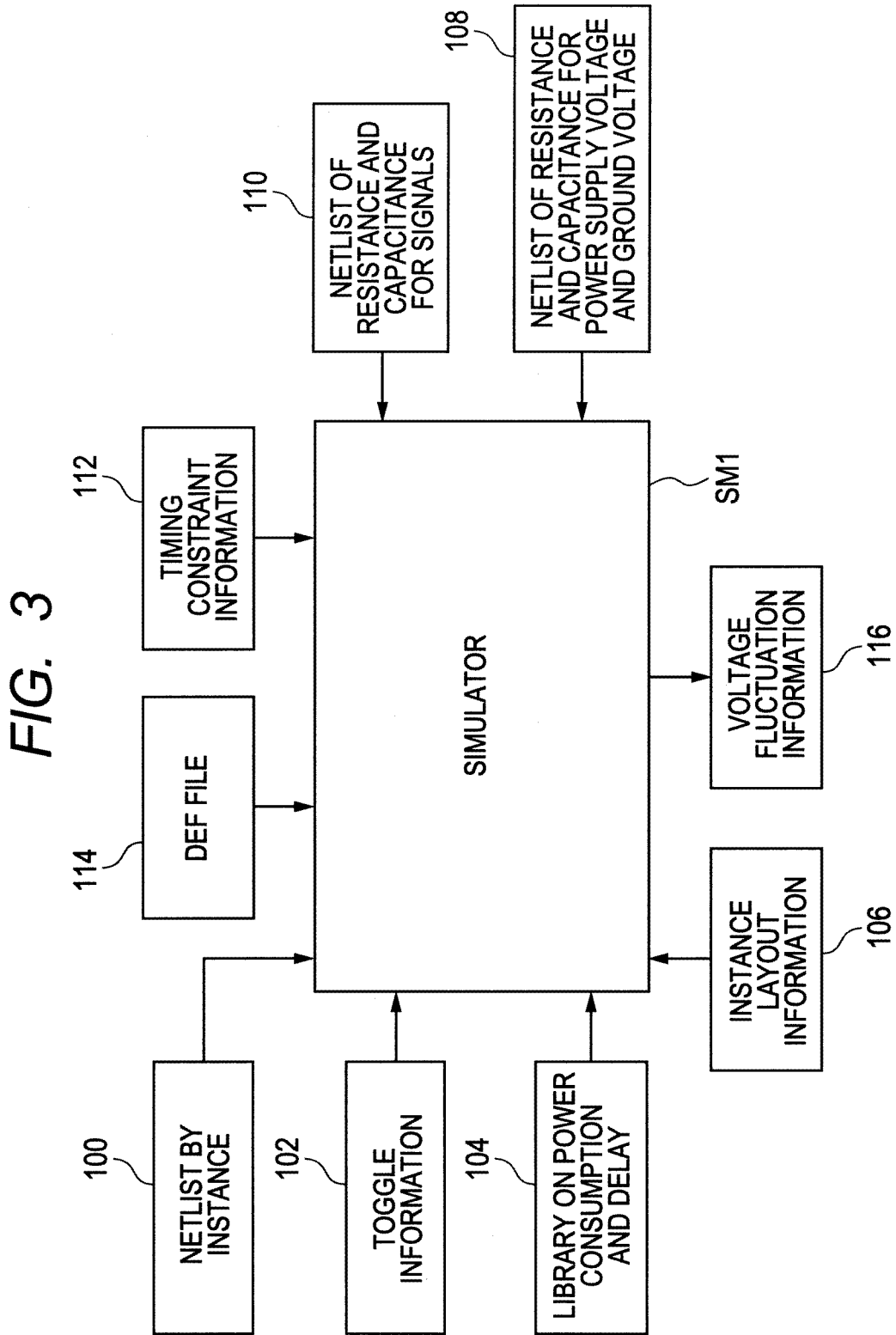
FIG. 3 is a diagram for explaining a simulator SM1 that executes a step of analyzing a voltage fluctuation at a gate level in step S2.

FIG. 3 is a diagram for explaining a simulator SM1 that executes a step of analyzing a voltage fluctuation at a gate level in step S2.

In FIG. 3, to the simulator SM1, a netlist 100 by instance, toggle information 102, a library 104 on power consumption and delay, instance layout information 106, a netlist 108 of resistance and capacitance for power supply and ground voltage, a netlist 110 of resistance and capacitance for signals, timing constraint information 112, and a DEF file 114 are input, and a voltage fluctuation analysis simulation is executed.

The netlist 100 by instance is information indicative of the relations of connection of instances. By the information, the circuit configuration of an instance is recognized. Generally, various functions of the semiconductor integrated circuit device are configured by a plurality of transistors and the like. It is assumed that the minimum unit of each function is a gate. Examples of the gate include a NAND circuit, a NOR circuit, an XOR circuit, an inverter circuit, and an FF (Flip Flop) circuit. Hard macro units such as an SRAM, a PLL circuit, an A/D converter, and a D/A converter are also included. Numbers are allocated to the various gates, and a gate which can be discriminated from the others is called an instance.

The toggle information 102 is input waveform information which is input to an instance or the like and includes the toggle rate of signals whose potential changes from high to low or from low to high.

In the library 104 on power consumption and delay, information table on power consumption and delay is stored by various gate units. From the information table, power consumption and delay can be calculated in accordance with the kind of a gate.

The instance layout information 106 is information on the layout of each instance.

The netlist 108 of resistance and capacitance for power supply voltage and the ground voltage is information on resistance and/or capacitance of a voltage wire coupled to the power supply voltage or ground voltage.

The netlist 110 of resistance and capacitance for signals is information on the parasitic capacitance between signal wires, resistance of signal wires, and the like.

The timing constraint information 112 includes information such as the frequency of each clock, the timing of switching of each gate, and a clock which performs control.

The DEF file 114 is physical hierarchical (layer) information or the like by which a gate is generated. By adding further another condition or information to the above-described information, a more detailed simulation may be executed.

As described above, the analysis at the gate level is a method of conducting analysis by using a gate obtained by abstracting information of a transistor. A transistor level in a gate is modelized, characteristics of the gate are analyzed in advance, and a library is formed (for example, a library on power consumption and delays).

Figure 4:
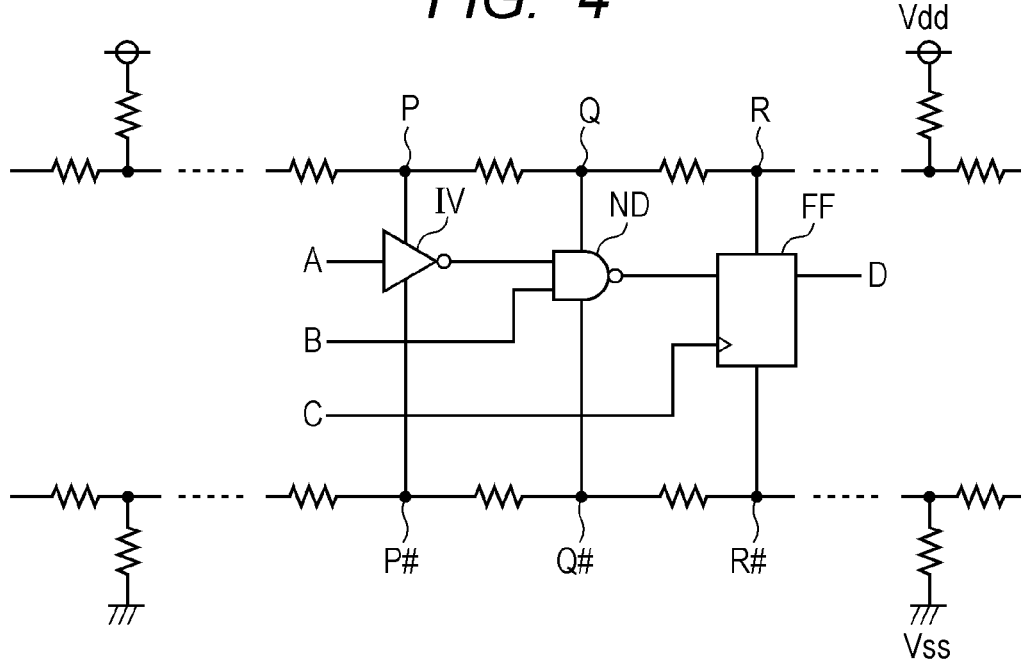
FIG. 4 is a diagram for explaining a part of a concrete example of a circuit which executes a voltage fluctuation analysis.

The voltage fluctuation information 116 is a result of the voltage fluctuation analysis made by the simulator SM1. FIG. 4 is a diagram for explaining apart of a concrete example of a circuit which executes the voltage fluctuation analysis.

With reference to FIG. 4, the information will be described concretely by using the circuit. The diagram shows the case where an inverter circuit IV, an NAND circuit ND, and a flip flop circuit FF are provided.

An input signal A is input to the inverter circuit IV, an input signal B is input to the NAND circuit ND, and an input signal C is input to the flip flop circuit FF.

The netlist 100 of each instance includes information of connection relations on instances of the inverter circuit IV, the NAND circuit ND, and the flip flop circuit FF.

The toggle information 102 includes, as an example, input waveform information of the timings of the input signals A, B, and C and the like.

The library 104 on power consumption and delays includes power consumption and a delay of each of the inverter circuit, the NAND circuit, and the flip flop circuit.

The instance layout information 106 includes information on the layout of each of the inverter circuit IV, the NAND circuit ND, and the flip flop circuit FF.

The netlist 108 of resistance and capacitance for power supply voltage and ground voltage includes information on the resistance and/or capacitance related to a voltage wire coupled to the power supply voltage Vdd and the ground voltage VSS to which the inverter circuit IV, the NAND circuit ND, and the flip flop circuit FF are coupled.

The netlist 110 of resistance and capacitance for signals includes information on the resistance and/or capacitance of a signal wire between the inverter circuit IV and the NAND circuit ND and information on resistance/capacitance and the like of a signal wire between the NAND circuit ND and the flip flop circuit FF.

The timing constraint information 112 includes, for example, information of the frequency of a clock in the case where the input signal C is a clock.

The DEF file 114 includes physical hierarchical information generated by the inverter circuit, the NAND circuit, and the flip flop circuit.

When the information is input to the simulator SM1, the voltage fluctuation analysis simulation on the circuit shown in FIG. 4 can be executed.

Figure 5A:
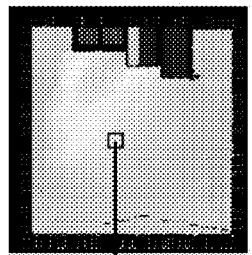
FIGS. 5A to 5C are conceptual diagrams showing the case where a voltage fluctuation analysis simulation is executed in the simulator SM1.
Figure 5B:
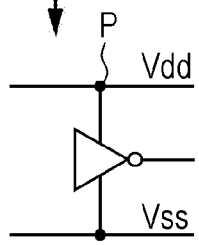
Figure 5C:
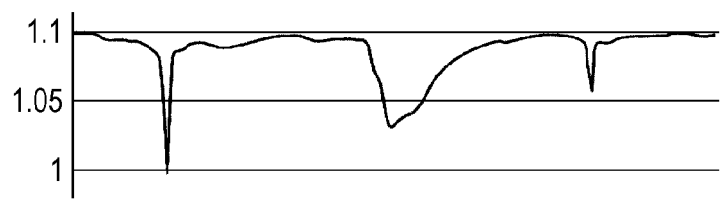

FIGS. 5A to 5C are conceptual diagrams showing the case where a voltage fluctuation analysis simulation is executed in the simulator SM1.

FIG. 5A shows the case where the voltage fluctuation analysis simulation is executed on the entire chip TP in the simulator SM1.

FIG. 5B shows the case where a partial region in the entire chip TP is extracted. In the example, the inverter circuit in FIG. 4 in the entire chip TP is extracted.

The extraction is an example. Another instance or a combination of a plurality of instances may be extracted.

FIG. 5C is a diagram for explaining fluctuations in the power supply voltage Vdd coupled to the instance.

FIG. 5C shows fluctuations in the power supply voltage Vdd. Concretely, the case where the voltage around 1.1V drops to about 1.0V due to a fluctuation is shown.

Although only the fluctuation waveform of the power supply voltage Vdd at the point P coupled to the inverter circuit is described here, the invention is not limited to the power supply voltage Vdd. The fluctuation waveform of the ground voltage Vss at a point P# coupled to the inverter circuit (for example, a fluctuation waveform which rises from 0V and bounds in a manner opposite to that of the power supply voltage) can be also similarly obtained. The fluctuation waveform can be similarly obtained not only at the points P and P# but also at other points Q, Q#, R, and R# shown in FIG. 4.

Although the three instances as a part of the chip TP are illustrated in FIG. 4, the fluctuation waveforms of the power supply voltage and the ground voltage of each of all of instances of the voltages of the chip TP are obtained by the simulator SM1.

Since the circuit simulation at the gate level, not the transistor level, is used to obtain the waveforms of the power supply voltage and the ground voltage of each instance, the voltage fluctuation analysis can be performed in short time.

The presence/absence of an instance whose power supply voltage drops below a predetermined permissible level or the presence/absence of an instance whose ground voltage becomes higher than a predetermined permissible level can be detected. In the case where there is a voltage fluctuation exceeding the permissible level, the circuit and the layout of the chip are corrected.

The acquisition of the fluctuation waveforms in the power supply voltage and the ground voltage in step S4 includes, for example, a mode of usably holding the power supply waveforms in a storage device on a computer.

Figure 6:
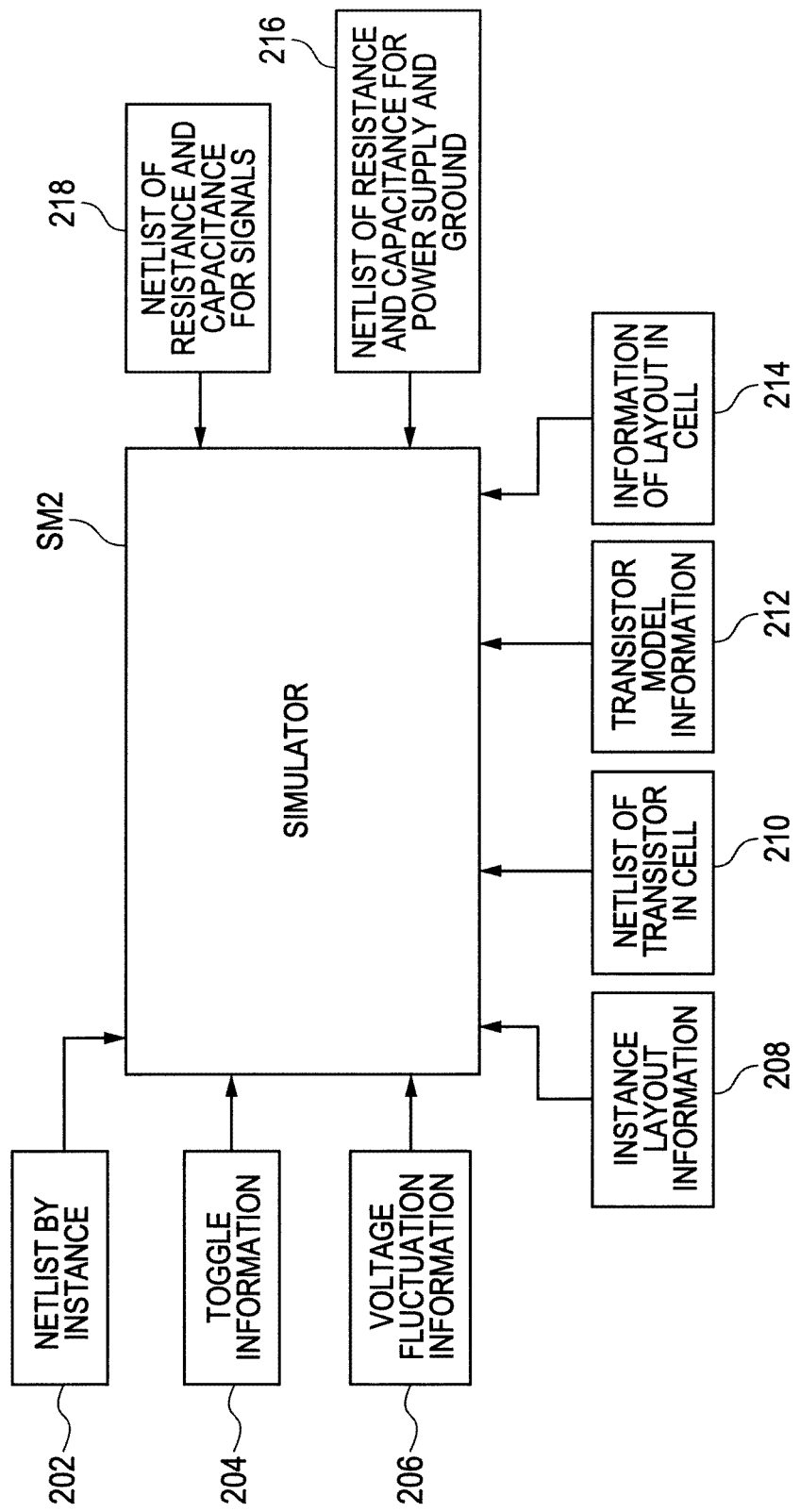
FIG. 6 is a diagram for explaining a simulator SM2 that executes a signal analysis step at a transistor level in step S6.

FIG. 6 is a diagram for explaining a simulator SM2 that executes a signal analysis step at a transistor level in step S6.

In FIG. 6, to the simulator SM2, a netlist 202 by instance, toggle information 204, voltage fluctuation information 206, instance layout information 208, a netlist 216 of resistance and capacitance for power supply and ground voltage, a netlist 218 of resistance and capacitance for signals, a DEF file 220, a netlist 210 of a transistor in a gate, transistor model information 212, and information 214 of layout in a gate are input, and a signal analysis simulation is executed. By the signal analysis simulation, a delay amount of a signal, jitter, and a noise amount at a specific point can be analyzed. The analysis at the transistor level means analysis using a net configured by a circuit including a transistor and a transistor model.

The case of executing an SPICE (Simulation Program Integrated Circuit Emphasis) simulation as the signal analysis simulation will be described.

The netlist 202 by instance is, as described above, information indicative of the relations of connection of instances. By the information, the circuit configuration of an instance is recognized.

The toggle information 204 is input waveform information which is input to an instance or the like and includes information indicative of the toggle rate of signals whose potential changes from high to low or from low to high.

The voltage fluctuation information 206 is waveform information of fluctuations in the power supply voltage and the ground voltage of each instance, based on a voltage fluctuation analysis simulation obtained by the simulator SM1 in FIG. 4. It is assumed that the voltage fluctuation information 206 is obtained by converting the format of the analysis result (voltage fluctuation information 116 in FIG. 4) of the voltage fluctuation analysis simulation made by the simulator SM1 as the voltage fluctuation information to a PWL (Piece Wise Linear) format for SPICE at the time of using the information in the simulator SM2 as an SPICE simulator.

The instance layout information 208 is information on the layout of each instance.

The netlist 216 of resistance and capacitance for power supply voltage and the ground voltage is information on resistance and/or capacitance of a voltage wire coupled to the power supply voltage or ground voltage.

The netlist 218 of resistance and capacitance for signals is information on the parasitic capacitance between signal wires, resistance of signal wires, and the like.

The netlist 210 of a transistor in a gate is, for example, information indicative of the connection relations of transistors and the like configuring the inverter circuit.

The model information 212 of a transistor is information on characteristic parameters of each transistor, such as the model number and the capacitance of a transistor.

The layout information 214 in a gate is, for example, information on the layout of a transistor and the like configuring the inverter circuit. By adding further another condition or information to the above-described information, a more detailed simulation may be executed.

Figure 7:
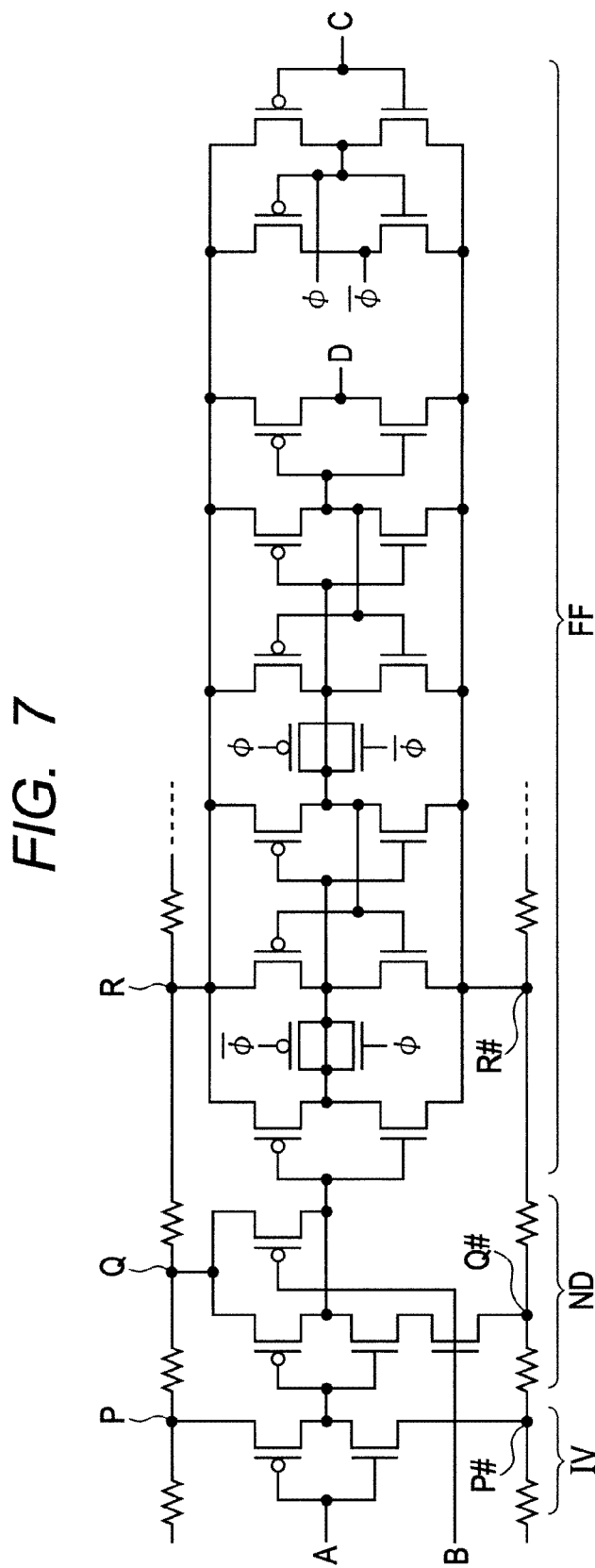
FIG. 7 is a diagram for explaining a concrete example of a circuit which executes a signal analysis.

FIG. 7 is a diagram for explaining a concrete example of a circuit which executes a signal analysis. FIG. 7 shows the case where the circuit illustrated in FIG. 4 is drawn at the transistor level.

The diagram shows the case where the inverter circuit IV, the NAND circuit ND, and the flip flop circuit FF shown in FIG. 4 are configured by transistors.

An input signal A is input to the inverter circuit IV, an input signal B is input to the NAND circuit ND, and an input signal C is input to the flip flop circuit FF. φ and /φ denote internal signals of the flip flop circuit FF.

As described above, the netlist 202 of each instance includes information of connection relations on instances of the inverter circuit IV, the NAND circuit ND, and the flip flop circuit FF.

The toggle information 204 includes, as an example, input waveform information of the timings of the input signals A, B, and C and the like.

The instance layout information 208 includes information on the layout of the inverter circuit IV, the NAND circuit ND, and the flip flop circuit FF.

The netlist 216 of resistance and capacitance for power supply voltage and ground voltage includes information on the resistance and/or capacitance related to a voltage wire coupled to the power supply voltage Vdd and the ground voltage VSS to which the inverter circuit IV, the NAND circuit ND, and the flip flop circuit FF are coupled.

The netlist 218 of resistance and capacitance for signals includes information on the resistance/capacitance of a signal wire between the inverter circuit IV and the NAND circuit ND and information on resistance/capacitance and the like of a signal wire between the NAND circuit ND and the flip flop circuit FF.

The netlist 210 of a transistor in a gate includes information indicative of connection relations of transistors configuring the inverter circuit, information indicative of connection relations of transistors configuring the NAND circuit, and information indicative of connection relations of transistors configuring the flip flop circuit.

The transistor model information 212 is, for example, information on the characteristic parameters of an N-channel MOS transistor and a P-channel MOS transistor.

The layout information 214 in a gate includes, for example, information on the layout of a transistor and the like configuring the inverter circuit.

The voltage fluctuation information 206 includes waveform information of the power supply voltage or ground voltage based on the voltage fluctuation analysis simulation obtained by the simulator SM1 in the circuit of FIG. 4, for example, waveform information of voltage fluctuations at points P, P#, Q, Q#, R, and R#.

When the information is input to the simulator SM2, the signal analysis can be executed. FIG. 7 illustrates three instances as a part of the chip TP. The simulator SM2 extracts waveform information of a voltage fluctuation on an instance included in a partial region (one or more functional modules) which are not all of the functional modules) in a chip to be subjected to the signal analysis in step S6 from the voltage fluctuation information 206 and performs the signal analysis on the basis of the extracted waveform information.

The reason why information on a library on power consumption and a delay is not input to the simulator SM2 is because values on the power consumption and a delay of each gate can be calculated on the basis of the netlist 210 of a transistor in a gate, the transistor model information 212, and the layout information 214 in a gate.

The reason why the timing constraint information is not input is because since the connection information and the wire information on all of the devices can be grasped on the basis of the above-described information, the switching timing of each gate, a clock which controls, and the like can be also calculated on the basis of the information.

When the information is input to the simulator SM2, the signal analysis simulation can be executed at the transistor level on the circuit shown in FIG. 7.

Figure 8A:
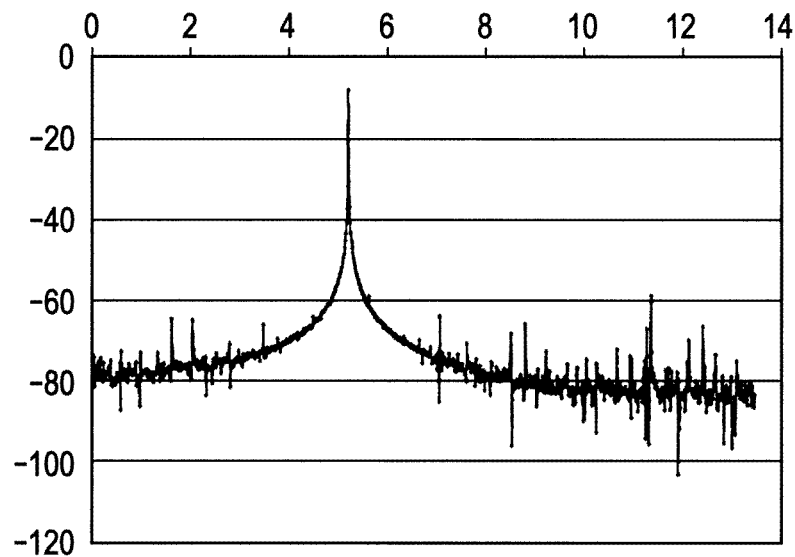
FIGS. 8A and 8B are diagrams showing a result of the case where the signal analysis simulation is executed in the simulator SM2.
Figure 8B:
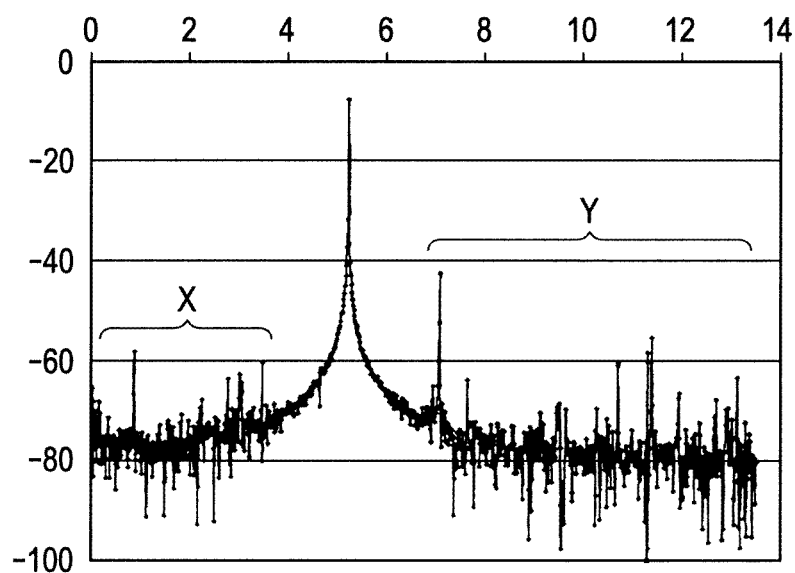

FIGS. 8A and 8B are diagrams showing a result of the case where the signal analysis simulation is executed in the simulator SM2.

FIG. 8A shows a frequency spectrum of an output signal of a circuit in the case of using the ideal power supply model in the simulator SM2.

FIG. 8B shows a frequency spectrum of an output signal of a circuit in the case of using the voltage fluctuation information 206 according to the embodiment of the present invention in the simulator SM2.

In FIG. 8A, signals except for the signal at the peak part have attenuated waveforms since the ideal power supply model is used. As shown in FIG. 8B, noises in regions X and Y which are not so obvious in FIG. 8A using the ideal power supply model can be recognized. That is, by the method according to the embodiment, noises which are not detected in a simulation using the ideal power supply model can be detected. By executing a simulation using an actual power supply model, a high-precision simulation result can be obtained.

Figure 9:
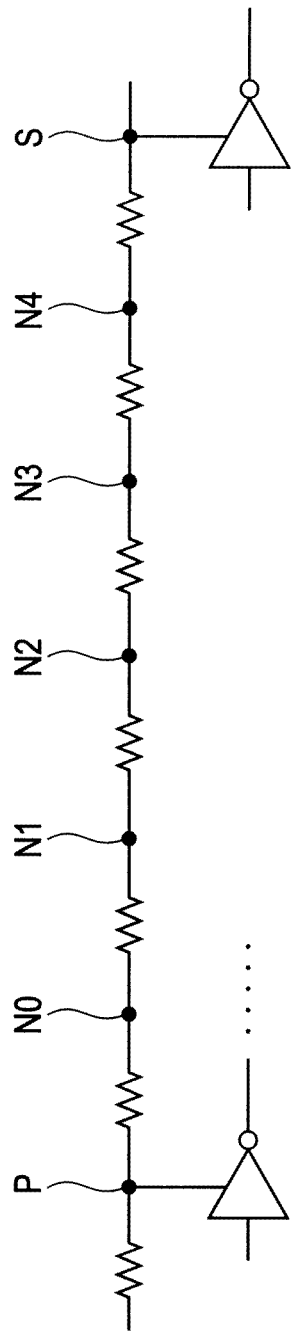
FIG. 9 is a diagram for explaining voltage fluctuation information according to a modification of the embodiment of the present invention.

FIG. 9 is a diagram for explaining voltage fluctuation information according to a modification of the embodiment of the present invention. In FIG. 9, points P and S are shown as points at which instances are coupled to the power supply voltage Vdd. Although the case of giving, as the voltage fluctuation information 206, waveform information of the power supply voltage and the like to the points P and S at which the voltage is coupled to the instances has been described as an example, the invention is not limited to the case. Waveform information of voltage fluctuations at other points, for example, points such as nodes N0 to N4 between the points P and S coupled to the instances may be also given. By including the information, an arithmetic process on the points becomes unnecessary, so that the arithmetic process in the simulator SM2 can be performed at higher speed.

In the example, the case of executing the voltage fluctuation analysis on the entire chip TP has been described as the voltage fluctuation analysis step at the gate level. The analysis may be executed not only on the entire chip TP but also in a wider region including a region in which the signal analysis step at the transistor level is executed.

In step S2, the voltage fluctuations in both of the power supply voltage and the ground voltage are analyzed, and the signal analysis is performed on the basis of the voltage fluctuations in both of the power supply voltage and the ground voltage in step S6. It is also possible to perform the voltage fluctuation analysis on either the power supply voltage or the ground voltage and, on the basis of voltage fluctuation information obtained as a result, perform the signal analysis.

Although the voltage fluctuation waveforms on all of instances in the chip are usably held in a storage device in a computer in step S4, for example, the voltage fluctuation waveform of only an instance in a region (functional module) in which the signal analysis in step S6 is conducted can be usably held.

The simulators SM1 and SM2 shown in FIGS. 3 and 6 may be realized by different computer systems or an integrated computer system.

A method of making a computer function to execute the controls described in the flow or a program for realizing the method can be also provided. Such a program may be recorded on a not-temporary computer-readable recording medium such as a flexible disk accompanying the computer, a CD-ROM (Compact Disk-Read Only Memory), a ROM (Read Only Memory), a RAM (Random Access Memory), a memory card, or the like and the resultant may be provided as a program product. A program may be also provided by being recorded on a recording medium such as a hard disk built in a computer. A program may be also provided by being downloaded via a network.

The invention may also employ a program which calls necessary modules in program modules provided as a part of the operation system (OS) of a computer in a predetermined sequence at a predetermined timing and executes processes. A program which does not include such modules is also included in the program according to the present invention.

The program according to the present invention may be provided by being assembled in a part of another program. In this case as well, a module included in the another program is not included in the program itself. A process is executed in cooperation with the another program. A program assembled in another program is also included in the program according to the invention.

The program product provided is installed in a program storage such as a hard disk and executed. The program product includes a program itself and a recording medium on which the program is recorded.

It is to be considered that the embodiments disclosed are illustrative and not restrictive in all of the aspects. The scope of the present invention is not defined by the scope of the claims rather than the foregoing description. All changes that fall within meets and bounds of the claims are intended to be embraced.

What is claimed is:

1. A circuit simulation method for verifying a semiconductor integrated circuit including a plurality of gates realizing a specific function by using a transistor, comprising the steps of:
   executing a voltage fluctuation analysis at a gate level on the semiconductor integrated circuit, without a transistor level analysis; and
   executing a signal analysis at a transistor level on a partial region in the semiconductor integrated circuit by using a result of the voltage fluctuation analysis,
   wherein the voltage fluctuation analysis at the gate level is executed on a region of the semiconductor integrated circuit, which includes the partial region and is wider than the partial region.

2. The circuit simulation method according to claim 1, further comprising the step of obtaining a result of the signal analysis with regard to an output signal of a circuit in the partial region.

3. The circuit simulation method according to claim 1, further comprising the step of obtaining the result of the voltage fluctuation analysis by converting a format of the voltage fluctuation analysis at the gate level to a format for a transistor level analysis.

4. The circuit simulation method according to claim 1, wherein the voltage fluctuation analysis at the gate level includes a step of analyzing a drop in power supply voltage and a rise in ground voltage.

5. The circuit simulation method according to claim 4, wherein in the step of executing the signal analysis at the transistor level, a result of an analysis on the power supply voltage and the ground voltage is used as power supply input information.

6. The circuit simulation method according to claim 1, wherein the voltage fluctuation analysis at the gate level is executed on an entire chip of the semiconductor integrated circuit, and the signal analysis at the transistor level is executed on at least one of a plurality of modules configuring the chip of the semiconductor integrated circuit.

* * * * *